United States Patent
Haunschild et al.

(10) Patent No.: US 12,425,010 B2
(45) Date of Patent: Sep. 23, 2025

(54) PULSE GENERATOR AND METHOD

(71) Applicant: Cypress Semiconductor Corporation, San Jose, CA (US)

(72) Inventors: Markus Haunschild, Markt Wald (DE); Martin Feldtkeller, Munich (DE); Lei Liao, Unterhaching (DE); Claudio Andreotti, Munich (DE)

(73) Assignee: Cypress Semiconductor Corporation, San Jose, CA (US)

( * ) Notice: Subject to any disclaimer, the term of this patent is extended or adjusted under 35 U.S.C. 154(b) by 38 days.

(21) Appl. No.: 18/581,132

(22) Filed: Feb. 19, 2024

(65) Prior Publication Data
US 2025/0266817 A1    Aug. 21, 2025

(51) Int. Cl.
*H03K 5/134*    (2014.01)
*H03K 5/135*    (2006.01)
*H03K 7/08*    (2006.01)
*H03K 5/00*    (2006.01)

(52) U.S. Cl.
CPC ............. *H03K 5/134* (2014.07); *H03K 5/135* (2013.01); *H03K 7/08* (2013.01); *H03K 2005/00058* (2013.01); *H03K 2005/00104* (2013.01)

(58) Field of Classification Search
None
See application file for complete search history.

(56) References Cited

U.S. PATENT DOCUMENTS 7,239,116 B2 *  7/2007  Tang ..................... H02M 3/157
                                              323/266
8,477,054 B2 *  7/2013  Scheytt ............... H04L 25/4902
                                              341/143

* cited by examiner

*Primary Examiner* — Cassandra F Cox

(57) ABSTRACT

A pulse generator comprises a circuit configured to generate a coarse pulse width (CPW) signal, a first delay unit configured to generate a first delayed coarse pulse width signal, a delay locked loop circuit configured to generate a first subphase signal and a second subphase signal, a first analog interpolator, a second analog interpolator, and an amplifier having a first input connected to the first analog interpolator and a second input connected to the second analog interpolator and configured to generate a fine pulse width modulation signal.

20 Claims, 10 Drawing Sheets

| DECIMAL | BINARY | | | THERMOMETER | | | | | | |
|---|---|---|---|---|---|---|---|---|---|---|
| | B[4] | B[3] | B[2] | $T_7$ | $T_6$ | $T_5$ | $T_4$ | $T_3$ | $T_2$ | $T_1$ |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |
| 6 | 1 | 1 | 0 | 0 | 1 | 1 | 1 | 1 | 1 | 1 |
| 7 | 1 | 1 | 1 | 1 | 1 | 1 | 1 | 1 | 1 | 1 |

Fig. 4A

| B[1] | B[0] | | $T_{OZ}$ | $T_{OY}$ | $T_{OX}$ |
|---|---|---|---|---|---|
| 0 | 0 | | 0 | 0 | 0 |
| 0 | 1 | | 0 | 0 | 1 |
| 1 | 0 | | 0 | 1 | 1 |
| 1 | 1 | | 1 | 1 | 1 |

Fig. 4B

PULSE GENERATOR AND METHOD

BACKGROUND

Regulated power supplies or voltage regulators are employed to provide the voltage and current supply to microelectronic devices. Switching power converters (SPC) also referred to as buck regulators provide high efficiency, high current capability, and topology flexibility. Buck regulators can provide precise voltage and current characteristics required by devices such as microprocessors, microcontrollers, memory devices, and the like.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a pulse generator comprises a circuit configured to generate a coarse pulse width signal based on a digital pulse code, a first delay unit configured to generate a first delayed coarse pulse width signal, a delay locked loop circuit configured to generate a first subphase signal and a second subphase signal based on a system clock signal, a first analog interpolator having a first input generated based on the coarse pulse width signal and the first subphase signal, a second input generated based on the first delayed coarse pulse width signal and the first subphase signal, and an output having a first delay configured based on the digital pulse code, a second analog interpolator having a first input generated based on the coarse pulse width signal and the second subphase signal, a second input generated based on the first delayed coarse pulse width signal and the second subphase signal, and an output having a second delay configured based on the digital pulse code, and an amplifier having a first input connected to the output of the first analog interpolator and a second input connected to the output of the second analog interpolator and configured to generate a fine pulse width modulation signal.

According to some embodiments, a method comprises generating a coarse pulse width based on a digital pulse code, generating a first delayed coarse pulse width signal based on the coarse pulse width signal, generating a first subphase signal and a second subphase signal in a delay locked loop circuit based on a system clock signal, generating a first output in a first analog interpolator receiving a first input generated based on the coarse pulse width signal and the first subphase signal and a second input generated based on the first delayed coarse pulse width signal and the first subphase signal, the first output having a first delay configured based on the digital pulse code, generating a second output in a second analog interpolator receiving a first input generated based on the coarse pulse width signal and the second subphase signal and a second input generated based on the first delayed coarse pulse width signal and the second subphase signal, the second output having a second delay configured based on the digital pulse code, and generating a fine pulse width modulation signal in an amplifier having a first input connected to the first output of the first analog interpolator and a second input connected to the second output of the second analog interpolator.

According to some embodiments, a system comprises means for generating a coarse pulse width signal based on a digital pulse code, means for generating a first delayed coarse pulse width signal based on the coarse pulse width signal, means for generating a first subphase signal and a second subphase signal in a delay locked loop circuit based on a system clock signal, means for generating a first output in a first analog interpolator receiving a first input generated based on the coarse pulse width signal and the first subphase signal and a second input generated based on the first delayed coarse pulse width signal and the first subphase signal, the first output having a first delay configured based on the digital pulse code, means for generating a second output in a second analog interpolator receiving a first input generated based on the coarse pulse width signal and the second subphase signal and a second input generated based on the first delayed coarse pulse width signal and the second subphase signal, the second output having a second delay configured based on the digital pulse code, and means for generating a fine pulse width modulation signal in an amplifier having a first input connected to the first output of the first analog interpolator and a second input connected to the second output of the second analog interpolator.

According to some embodiments, a digital controller comprises an analog-to-digital converter configured to generate a feedback voltage, a voltage control unit configured to generate a target voltage, a digital compensator configured to receive a voltage error signal based on the feedback voltage and the target voltage and generate a digital pulse code based on the voltage error signal, and a pulse generator configured to generate a fine pulse width modulation signal based on the digital pulse code, the pulse generator comprising a circuit configured to generate a coarse pulse width signal based on the digital pulse code, a first delay unit configured to generate a first delayed coarse pulse width signal, a delay locked loop circuit configured to generate a first subphase signal and a second subphase signal based on a system clock signal, a first analog interpolator having a first input generated based on the coarse pulse width signal and the first subphase signal, a second input generated based on the first delayed coarse pulse width signal and the first subphase signal, and an output having a first delay configured based on the digital pulse code, a second analog interpolator having a first input generated based on the coarse pulse width signal and the second subphase signal, a second input generated based on the first delayed coarse pulse width signal and the second subphase signal, and an output having a second delay configured based on the digital pulse code, and an amplifier having a first input connected to the output of the first analog interpolator and a second input connected to the output of the second analog interpolator and configured to generate the fine pulse width modulation signal.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 4A is a truth table of a thermometer encode circuit, in accordance with some embodiments.

FIG. 4B is a truth table of a decoder, in accordance with some embodiments.

DETAILED DESCRIPTION

Figure 1:
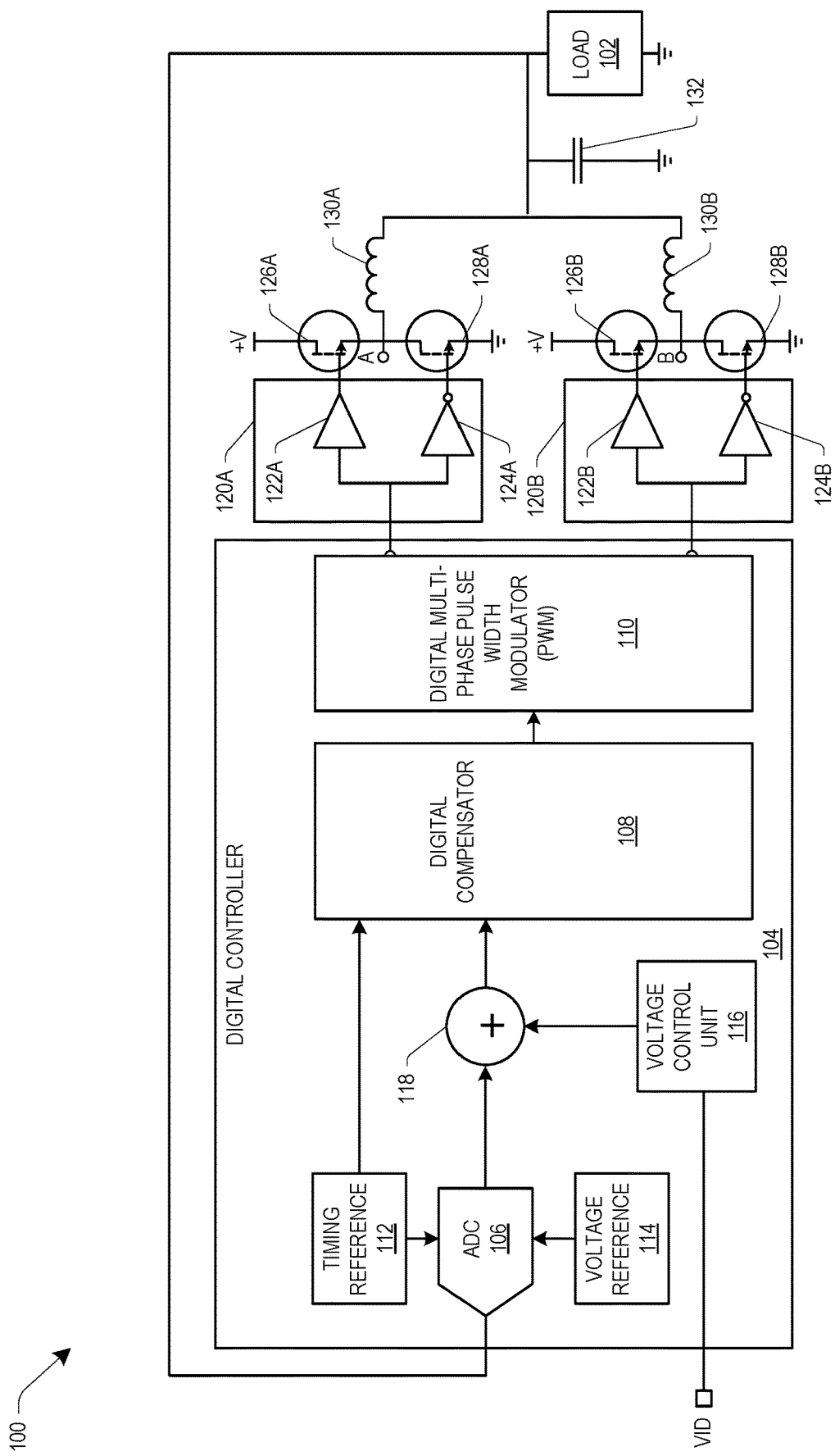
FIG. 1 is a schematic diagram of a digital multiphase buck converter, in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

FIG. 1 is a schematic diagram of a digital multiphase buck converter 100, in accordance with some embodiments. The digital multiphase buck converter 100 converts a relatively high supply voltage (+V), for example 12V, to a lower voltage, for example, 1V to 3V for powering a load 102 at high current levels. A digital controller 104 comprises an analog-to-digital converter (ADC) 106, a digital compensator 108, a digital multi-phase pulse width modulator (PWM) 110, a timing reference 112, a voltage reference 114, a voltage control unit 116, and a summing circuit 118. The PWM 110 outputs a series of pulses to driver circuits 120A, 120B, each comprising a high side driver 122A, 122B and a low side driver 124A, 124B. The PWM 110 provides a phase 1 signal to the driver circuit 120A and a phase 2 signal to the driver circuit 120B. The number phases and driver circuits 120A, 120B may vary depending on the number of phases in the multi-phase system. The high side drivers 122A, 122B provide drive signals for high side transistors 126A, 126B, and the low side drivers 124A, 124B provide drive signals for low side transistors 128A, 128B. The transistors 126A, 128A charge an inductor 130A, and the transistors 126A, 128B charge an inductor 130B. Energy in the inductors 130A, 130B charge a capacitor 132 to an output voltage suitable for the load 102. The transistors 126A, 128A and the inductor 130A define a first pulse output stage, and the transistors 126B, 128B and the inductor 130B define a second pulse output stage. Charging the capacitor 132 using out of phase pulse output stages reduces ripple in the output voltage on the capacitor 132. In some embodiments, the digital controller 104 and the driver circuits 120A, 120B may be provided as separate or combined integrated circuit packages, and the transistors 126A, 126B, 128A, 128B, inductors 130A, 130B, and the capacitor 132 are discrete devices. The load 102 may be a microelectronic component, such as a microprocessor, requiring accurate power that is regulated and maintained under rapidly changing power requirements.

In some embodiments, the digital controller 104 receives a VID input at the voltage control unit 116. The VID parameter is a binary number corresponding to a specific power requirement, for example as defined by a manufacturer of the load 102. In some embodiments, the VID defines a set point including an initial load line voltage at a minimum current. The ADC 106 receives a feedback voltage, e.g., the voltage on the capacitor 132, the timing reference 112, and the voltage reference 114. The output of the analog to digital converter ADC 106 is calibrated based on the voltage reference 114. The timing reference 112 provides a timing signal that determines the sampling rate at which the analog values are sampled and converted to digital values by the ADC 106. The timing reference 112 is also supplied to the digital compensator 108 and elsewhere in the circuitry as may be required to achieve synchronous operation.

The output of the ADC 106 is a digital voltage value that is compared to the output of voltage control unit 116 (i.e., the target voltage) in the summing circuit 118 and provided as a digital error voltage to the digital compensator 108. The digital compensator 108 provides inputs to the PWM 110 to modify the width of the pulses provided to the driver circuits 120A, 120B for the two phases in the illustrated example, and other phases, when utilized. The driver circuit 120A drives the high side transistor 126A and the low side transistor 128A with complementary signals. The high side transistor 126A and the low side transistor 128A have their drain-source paths connected in series at a common node A between a supply voltage source (e.g., +V) and a reference voltage source (e.g., ground). In some embodiments, the high side transistor 126A and the low side transistor 128A are both n-type devices, and only one of the two transistors 126A, 128A is on at any one time. If the high side transistor 126A were to be replaced with a p-type transistor, then the same phase signal could be used to drive the gate of both transistors 126A, 128A. Similarly, the driver circuit 120B drives the high side transistor 126B and the low side transistor 128B with complementary signals. The high side transistor 126B and the low side transistor 128B have their drain-source paths connected in series at a common node B between the supply voltage source (e.g., +V) and the reference voltage source (e.g., ground).

In operation, during phase 1, while the pulse width modulated waveform turns the high side transistor 126A on, current flows through the high side transistor 126A into the common node A and through the inductor 130A to charge the capacitor 132 and provide power to load 102. When the low side transistor 128A is turned on, current flows through the low side transistor 128A. The high side transistor 126B and the low side transistor 128B are connected at the common node B and operate in a similar manner during phase 2. The voltage from the load 102 is fed back to ADC 106 so that the voltage to the load can be adjusted according to changing load conditions. In some embodiments, the voltages at node A and node B (and other corresponding nodes in systems with more phases) may be measured as an indication of the current being supplied to the load 102. Improved power regulation in the power provided to the load 102 may be achieved by more accurately regulating the pulse width of pulses produced by the PWM 110.

Figure 2:
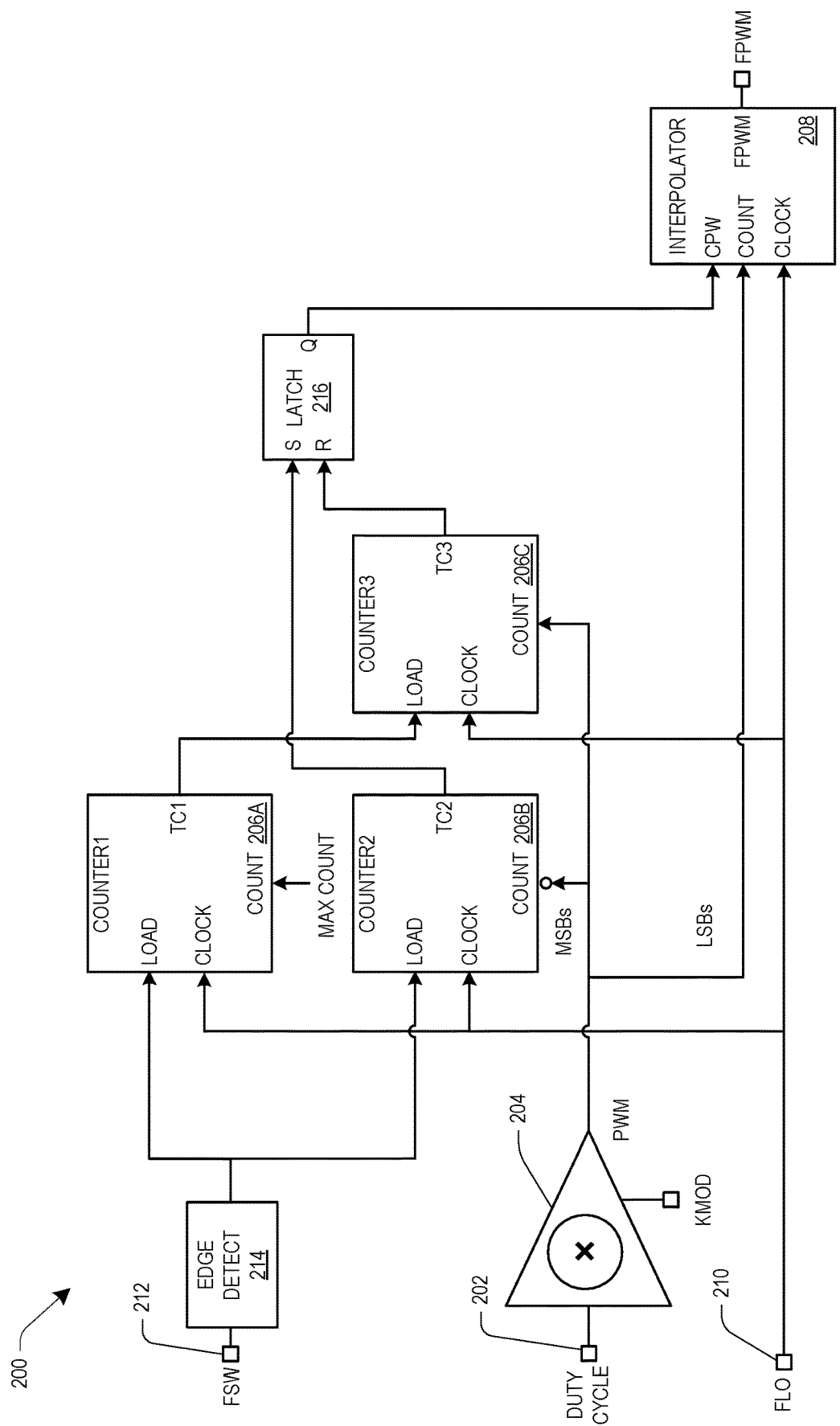
FIG. 2 is a schematic diagram of one phase of a double edge pulse width modulation (PWM) generator, in accordance with some embodiments.

FIG. 2 is a schematic diagram of one phase of a double edge modulation PWM generator 200, in accordance with some embodiments. The PWM generator 200 generates one phase of the PWM 110 illustrated in FIG. 1. The duty cycle from the digital compensator 108 is received at an input 202. The output of the digital compensator 108 is a binary number representing the duty cycle. The magnitude of the duty cycle number determines the width of the pulses produced by the PWM generator 200. The actual duty cycle number is the ratio of time that the pulse is high divided by the maximum time the pulse could be high (i.e., to achieve 100% duty cycle).

The duty cycle at input 202 is received by a multiplier unit 204, which multiplies the duty cycle by a parameter, Kmod. The parameter Kmod is a fixed number representing the number of clock cycles corresponding to a 100% duty cycle. By way of example, if the maximum number of clock cycles (to achieve maximum pulse width, i.e., 100% duty cycle) is 24 and the duty cycle number is 4.3 divided by 24, then the output of multiplier unit 204 is 4.3. The output of multiplier unit 204 is connected to counters 206A, 206B, 206C and an interpolator 208. The counters receive the most significant bits (MSBs), i.e., the number to the left of the decimal point, while interpolator 208 receives the least significant bits (LSBs), i.e., the number to the right of the decimal point. At a second input 210, the PWM generator 200 receives a high frequency local oscillator input, FLO, as a clock input to the counters 206A, 206B, 206C and the interpolator 208.

At a third input 212, the PWM generator 200 receives a switching clock waveform at an edge detect circuit 214. The edge detect circuit 214 produces an FSW edge pulse having a delayed rising edge and a pulse width of one cycle of the FLO signal. The rising edge of the FSW edge pulse is applied to the load input of the counters 206A, 206B. When the rising edge of the FSW pulse is received at the respective load inputs, the counters 206A, 206B begin counting pulses at the rate set by the clock input. The counter 206A begins counting at 24, the maximum number of pulses for a 100% duty cycle. This maximum count is a fixed value that is pre-programmed into the counter 206A. The counter 206B begins the count at the number 19 which is the one's complement of 4. This value results because the value represented by the MSBs received from the multiplier unit 204 is inverted at the input to the counter 206B.

When the count in the counter 206B reaches "1", the counter 206B provides an output TC2 and then stops at "0". The falling edge of TC2 sets the value in an SR latch 216, producing the rising edge of a coarse pulse width signal (CPW) provided to the interpolator 208. When the counter 206A reaches its terminal count, the counter 206A provides a TC1 pulse to the load input of the counter 206C so that the counter 206C begins counting. When the counter 206C reaches its terminal count (after counting the exemplary number 4 provided by the MSB input), it provides a TC3 output, the fall of which resets the SR latch 216 causing the falling edge of CPW. The CPW is received as an input to interpolator 208. The interpolator 208 receives, as a second input, the count of the least significant bits. As a third input, the interpolator 208 receives the FLO signal. The output of the interpolator 208 is a fine pulse width modulated signal (FPWM). Any desired resolution can be achieved for the FPWM signal and is equal to the cycle period of the FLO signal divided by $2^n$, where n is equal to the number of bits that define the LSBs. In the current example, the LSBs are defined by 6 bits (PWM[0] to PWM[5]) and the high frequency clock has a period of 6.4 ns. 6.4 ns divided by 2 to the sixth power equals 100 ps, the exemplary resolution. The number of required MSBs is determined by the maximum required pulse width. As is well known, five binary bits would provide for a pulse width of up to 32 clock cycles.

Figure 3:
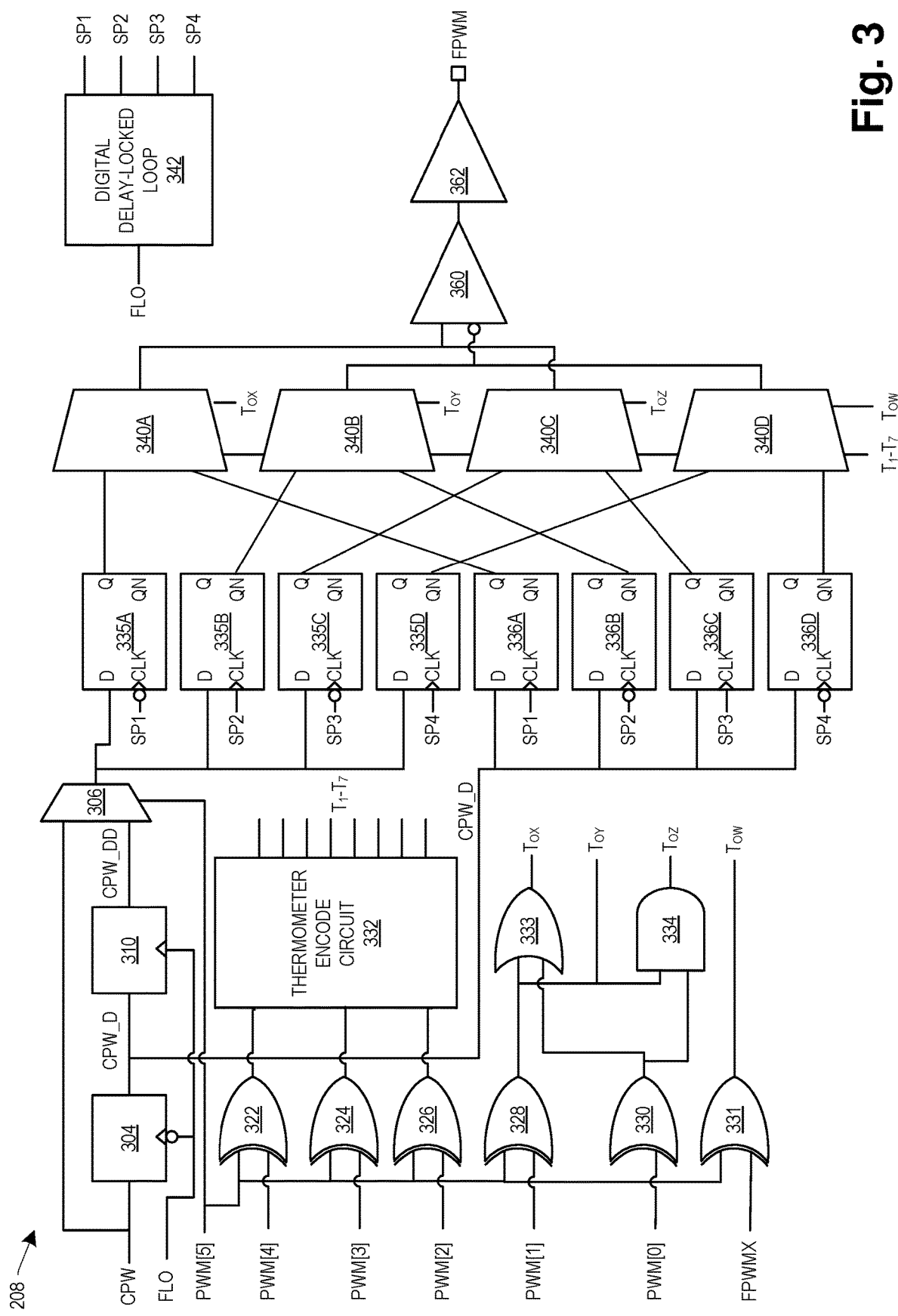
FIG. 3 is a schematic diagram of an interpolator in a double edge PWM generator, in accordance with some embodiments.

FIG. 3 is a schematic diagram of the interpolator 208 in a double edge pulse width modulation (PWM) generator, in accordance with some embodiments. The interpolator 208 receives the outputs of the PWM generator 200 of FIG. 2. In the illustrated example, the interpolator 208 is a 6-bit fine interpolator, but other bit counts may be used. The interpolator 208 receives, as a first input, the CPW signal into a half delay circuit 304 and a 2:1 multiplexer 306. At a second input, the fine interpolator 208 receives the FLO signal for clocking the half delay circuit 304 and a half delay circuit 310. The FLO signal is inverted at the clock input of the half delay circuit 304, so the half delay circuit 304 is triggered by a falling edge of the FLO signal and the half delay circuit 310 is triggered by a rising edge of the FLO signal. The output of the half delay circuit 304, a half cycle delayed coarse pulse width signal (CPW_D), is provided as an input to the half delay circuit 310, which outputs a full cycle delayed coarse pulse width signal (CPW_DD) to the multiplexer 306. The multiplexer 306 then outputs either the CPW signal or the CPW_DD signal, depending on whether the select input of the multiplexer 306 is a binary 0 or 1. The CPW signal is synchronized with a rising edge of the system clock signal, the CPW_D signal is synchronized with a falling edge of the system clock signal (half cycle delay), and the CPW_DD is synchronized with a rising edge of the system clock delayed by a full cycle. Note that select input of the multiplexer 306 is one of the outputs (e.g., PWM[5]) of the multiplier unit 204 in FIG. 2.

In the current example, the output of digital compensator 108 in FIG. 1 is assumed to be 4.33 clock cycles, so the value of the LSBs correspond to 0.33. The PWM[5] signal on the select input of the multiplexer 306 will be "0" if the number is between 4.0 and 4.5 clock cycles and "1" if the number is between 4.5 and 5.0 clock cycles. In turn, the output of multiplexer 306 will be a pulse width corresponding to 4 clock cycles if the input on the select input of the multiplexer 306 is "0" and a pulse width corresponding to 5 clock signals if the input on the select input of the multiplexer 306 is "1". The PWM[5] signal is also provided as an input to exclusive OR gates 322, 324, 326, 328, 330, 331.

When PWM[5] is at a binary "0", the true value of LSBs PWM[0] to PWM[4] are passed through each of the XOR gates 322, 324, 326, 328, 330, 331 unchanged. As the numeric value of the LSBs increases, the fine pulse width increases. As the value of PWM[5] switches from "0" to "1", when the output of multiplexer 306 is switched from CPW to CPW_DD, the outputs of all the XOR gates 322, 324, 326, 328, 330, 331 are inverted, as well. Thus, as the encoders (thermometer encoder T1-T7) receive inverted inputs to encode and pass on to the control electrodes of the transistors in FIG. 5A, the control electrodes previously receiving the CPW signal now receive the CPW_DD signal. This allows for a smooth transition as the output of the analog interpolator begins to produce a fine pulse width in the range of 4.5 to 5 clock cycles (instead of 4.0 to 4.5 clock cycles when the CPW signal was received).

The other LSB outputs of the multiplier unit 204, PWM [0] to PWM[4], are provided as a second input to the exclusive OR gates 322, 324, 326, 328, 330. The double edge modulation fine interpolator comprises an additional exclusive OR gate 331 that receives a FPWMX signal in addition to the PWM[5] signal and outputs a $T_{OW}$ signal. The FPWMX signal is a binary "1" for rising edge interpolation and a binary "0" for falling edge interpolation. The FPWMX signal goes high when the rising edge of the FSW signal is detected and goes low when the rising edge computational period is finished, as indicated by the TC1 of the counter 206A.

The outputs of the exclusive OR gates 322, 324, 326 are coupled to a thermometer encode circuit 332. The binary value of the three inputs is translated to outputs on lines T1-T7. The thermometer encode circuit 332 translates binary inputs to thermometer outputs in accordance with the truth table of FIG. 4A. In the thermometer encode circuit 332, only one of the lines T1-T7 is changed at any one time as the binary code is incremented or decremented.

The XOR gate 328 provides an output to an OR gate 333, an AND gate 334, and a $T_{OY}$ signal. The exclusive OR gate 330 provides an output to the OR gate 333 and the AND gate 334. The gates 333, 334 form a binary decoder function. Depending on the input value of PWM[0] and/or PWM[1], the output of the decoder with respect to $T_{OX}$, $T_{OY}$, $T_{OZ}$, and $T_{OW}$, is as illustrated in FIG. 4B. Because only one of the lines T1-T7 is changed at any one time, only one of lines $T_{OX}$, $T_{OY}$, or $T_{OZ}$ changes at any one time.

The output of the multiplexer 306 (CPW or CPW_DD) is provided to data elements 335A, 335B, 335C, 335D. The output of the half delay circuit 304 (CPW_D) is provided to data elements 336A, 336B, 336C, 336D. The Q outputs of the data elements 335A 336A provide inputs to an analog interpolator 340A. The QN outputs of the data elements 335B 336B provide inputs to an analog interpolator 340B. The Q outputs of the data elements 335C 336C provide inputs to an analog interpolator 340C. The QN outputs of the data elements 335D 336D provide inputs to an analog interpolator 340D.

In some embodiments, a digital delay-locked loop (DDLL) 342 generates clock signals for the data elements 335A, 335B, 335C, 335D, 336A, 336B, 336C, 336D. The DDLL 342 outputs multiple subphase signals SP1, SP2, SP3, SP4 based on the FLO signal. The clock inputs of the data elements 335A, 335O, 336B, 336D are inverted. The analog interpolators 340A, 340B, 340C, 340D also receive inputs from the binary decoder formed by the OR gate 333 and the AND gate 334 such that the $T_{OX}$ input is provided to the analog interpolator 340A, the Toy input is provided to the analog interpolator 740B, and the $T_{OZ}$ input is provided to the analog interpolator 340C. In the case of double edge modulation in the interpolator 208, the analog interpolator 340D receives an input $T_{OW}$ from the exclusive OR gate 331.

The seven thermometer code outputs T1-T7 are inputted to the analog interpolators 340A, 340B, 340C, 340D, giving each of the analog interpolators 340A, 340B, 340C, 340D a weight of 4. These seven thermometer code outputs T1-T7 multiplied by the weight of 4 gives a maximum weight of 28 to the thermometer code outputs T1-T7. The decoded output value of the LSBs PWM[0] and PWM[1] is inputted to the analog interpolators 340A, 340B, 340C, 340D (see FIG. 4B) with a weight of one each and a total maximum weight of 3. This arrangement provides the interpolator 208 with 0 to 31 weighting and a 1/32 resolution.

The single ended outputs of the analog interpolators 340A, 340C are connected to a first input of a differential to single ended amplifier 360, and the outputs of the analog interpolators 340B, 340C are connected to a complement input of the differential to single ended amplifier 360. The output of the differential to single ended amplifier 360 is provided to a buffer 362 to produce the FPWM (FPWM) signal. The use of four analog interpolators 340A, 340B, 340C, 340D compensates for offsets and errors, smooths out the interpolation, and improves linearity, i.e., the precision accuracy of the FPWM signal. The use of the DDLL 342 to generate the subphase signals SP1, SP2, SP3, SP4 provides increased linearity over various values of FLO signal.

FIGS. 5A-5D are schematic diagrams illustrating a stage of an analog interpolator 500, e.g., one of the analog interpolators 340A, 340B, 340C, 340D, in accordance with some embodiments. In the illustrated embodiment complementary metal oxide semiconductor (CMOS) field effect transistors (FETs) are shown. CMOS transistors can be designed with channel regions having specific width to length ratios, a feature used in the analog interpolators 340A, 340B, 340C, 340D to increase the inherent resistance value of each transistor to increase rise times and, thereby, smoothing out transitions.

Figure 5A:
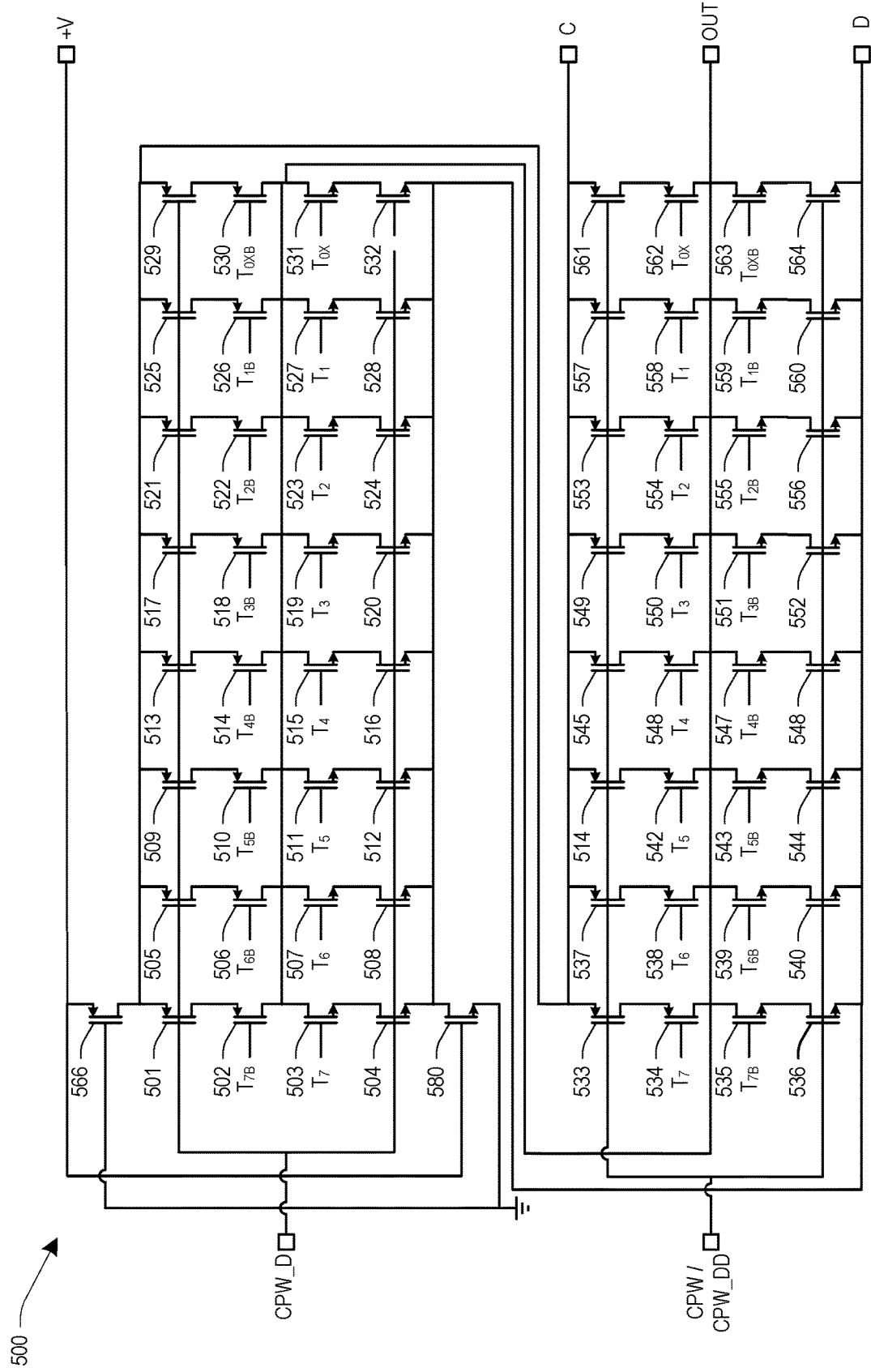
FIGS. 5A-5D are schematic diagrams illustrating a stage of an analog interpolator, in accordance with some embodiments.

The analog interpolator 500 of FIG. 5A comprises 16 sets of series connected transistors. Each of the 16 sets (also known as "legs") includes four series-connected FETs, coupled between a positive and negative voltage source, to form an inverter. The first leg includes transistors 501, 502, 503, 504, where the transistors 501, 502 are P-channel devices and the transistors 503, 504 are N-channel devices. The second leg includes transistors 505, 506, 507, and 508. The third leg includes transistors 509-512. The fourth leg includes transistors 513-516. The fifth leg includes transistors 517-520. The sixth leg includes transistors 521-525. The seventh leg includes transistors 525-528. The eighth leg includes transistors 529-532. The ninth leg includes transistors 533-536. The tenth leg includes transistors 537-540. The eleventh leg includes transistors 541-544. The twelfth leg includes transistors 545-548. The thirteenth leg includes transistors 549-552. The fourteenth leg includes transistors 553-556. The fifteenth leg includes transistors 557-560. The sixteenth leg includes transistors 561-564.

A transistor 566 is coupled between the positive supply voltage source and the commonly connected upper end of all the legs at node C. A transistor 580 is coupled between the negative voltage source and the commonly connected lower end of all of the legs at node D. The transistor 566 has its gate electrode connected to ground and the transistor 580 has its gate electrode connected to the positive supply voltage source to provide resistive current limiting. Current limiting across all the legs is balanced by the use of the same 2 transistors for all the legs. The circuit of FIG. 5A is described in the context of the analog interpolator 340A. However, the other analog interpolators 340B, 340C, 340D are substantially identical, with only minor differences. In this regard, nodes C and D are commonly connected in all 4 analog interpolator stages further balancing the current limiting of transistors the 566, 580. A single pair of current limiter transistors 566, 580 located only in one analog interpolator stage, e.g., in the analog interpolator 340A but not in the analog interpolators 340B, 340C, 340D, is used to provide balanced current limiting in all four analog interpolators 340A, 340B, 340C, 340D.

The transistors 501, 505, 509, 513, 517, 521, 525, 529, 504, 508, 512, 516, 520, 524, 528, 532 receive the CPW_D input at their respective gate electrodes. The transistors 533, 537, 541, 545, 549, 553, 557, 561, 536, 540, 544, 548, 552, 556, 560, 564 receive the CPW or CPW_DD input, as selected by the multiplexer 306, at their respective gate electrodes. The outputs of thermometer encode circuit 332 (T1, T2, T3, T4, T5, T6, T7) are received at the gate electrodes of the transistors 527, 523, 519, 515, 511, 507, 503, respectively, and at the gate electrodes of the transistors 558, 554, 550, 546, 542, 538, 534, respectively. The inverted outputs of the thermometer encode circuit 332 (T1B, T2B, T3B, T4B, T5B, T6B, T7B) are received at the gate electrodes of the transistors 526, 522, 518, 514, 510, 506, 502, respectively, and at the gate electrodes of the transistors 559, 555, 551, 547, 543, 539, 535, respectively. The outputs of the inverters are connected together and generate the output of the analog interpolator.

The analog interpolator 340D receives an input identified as $T_{0W}$. Note that for double edge modulation, $T_{0W}$ is the output of the XOR gate 331 providing an output in response to the FPWMX and PWM[5] inputs.

Figure 5D:
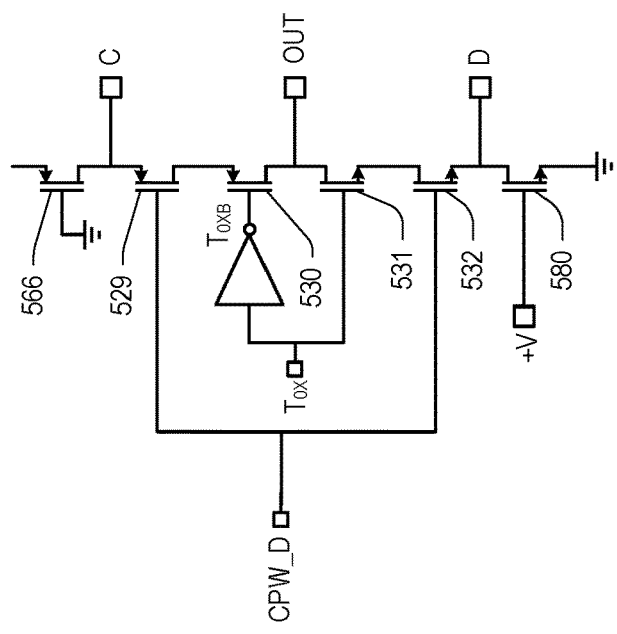
Figure 5C:
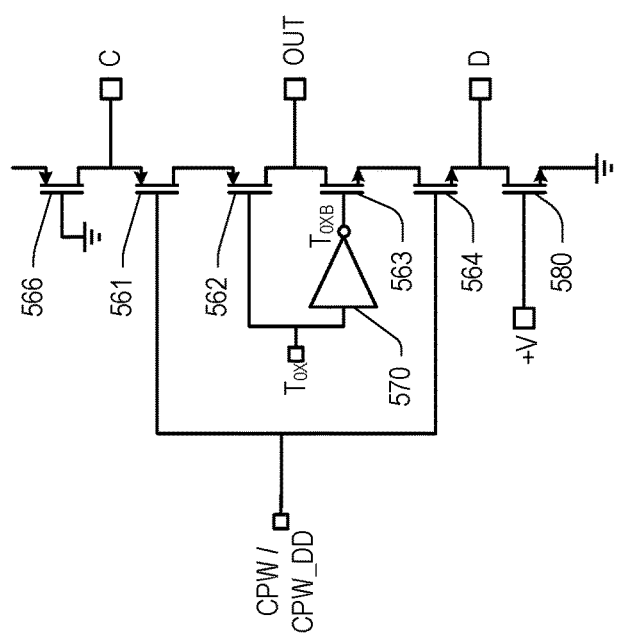
Figure 5B:
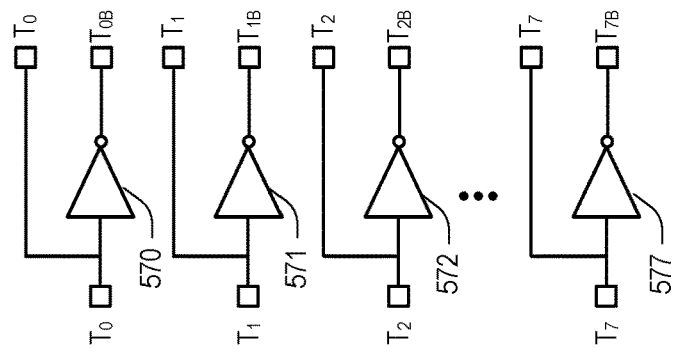

With continued reference to FIG. 5A and also referencing FIG. 5B, an exemplary inverter connection is illustrates. The input $T_0$ is inverted in an inverter 570 to produce $T_{0B}$. An inverter 571 produces $T_{1B}$, an inverter 572 produces $T_{2B}$, and an inverter 577 produces $T_{7B}$. Signals T3-T6 are connected in the same manner although not specifically shown in FIG. 5B.

FIG. 5C illustrates the connection of the $T_{0X}$ input to the analog interpolator 340. The gate electrodes of the transistors 561, 664 receive either the CPW or CPW_DD signals. The $T_{0X}$ signal is coupled to the control electrode of the transistor 562 while the inverted signal $T_{0XB}$ is coupled to the gate electrode of the transistor 563. The $T_{0XY}$ input to analog interpolator 340B, the $T_{0Z}$ input to the analog interpolator 340C, and the $T_{0W}$ input to the analog interpolator 340D are similarly connected.

FIG. 5D illustrates additional connections of the $T_0$ input to the analog interpolator 340. FIG. 5D illustrates the leg comprising transistors 529, 532 having gate electrodes connected to receive the CPW_D. An analog interpolator 340A, 340B, 340C, 340D receives two coarse pulse width inputs at any one time, the CPW_D signal and one of either the CPW signal or the CPW_DD signal. At any instant in time, it is possible for both waveforms to be at the same level, e.g., down level or up level, or for one of these waveforms to transition from one level to the other while the other one of the two waveforms remains unchanged. The output of the analog interpolator 340A, 340B, 340C, 340D will vary in accordance with the control signals.

The $T_{0X}$ signal is coupled to the gate electrode of the transistor 531 while the inverted signal $T_{0XB}$ is coupled to the gate electrode of the transistor 530. The $T_{0XY}$ input to analog interpolator 340B, the $T_{0Z}$ input to the analog interpolator 340C, and the $T_{0W}$ input to the analog interpolator 340D are similarly connected. FIGS. 5C and 5D also show the current limiting transistors 566 and 580.

Collectively, the decoded LSBs defined by the $T_0$-$T_7$ and the $T_{0B}$-$T_{7B}$ signals control transistors in the analog interpolators 340A, 340B, 340C, 340D to define the FPWM signal output of the analog interpolators 340A, 340B, 340C, 340D.

As the earliest of the coarse pulses transitions from high to low, the output of the analog interpolator 500 transitions from high to low a short time thereafter, depending on how many of the control electrodes $T_0$ to $T_7$, and conversely $T_{0B}$ to $T_{7B}$, are up or down. The output of the four analog interpolators 340A, 340B, 340C, 340D is inputted to the two inputs of the differential to single end output amplifier 360. As the higher one of the inputs decreases in value the lower one of the inputs increases. When the relative magnitude of the two inputs reverses, also known as a zero crossing, the output of the differential to single ended amplifier 360 that is inputted into the buffer 362 changes state and causes the buffer 362 to change the state of its output, thereby causing the falling edge of the FPWM signal to transition from high to low and providing the desired pulse width.

As an example of the operation of the circuit of FIG. 5A, continue with the assumption that the fine pulse width to be achieved is 4.33 cycles wide. In this case, the signal received from multiplexer 306 (FIG. 3B) is the CPW signal having a coarse pulse width of 4. The up level of this pulse is applied to the control electrodes of the transistors 533, 537, 541, 545, 549, 553, 557, 561. Since these transistors 533, 537, 541, 545, 549, 553, 557, 561 are P-type, they are held non-conducting when a high level signal is applied. The same CPW pulse is applied to the control electrodes of the transistors 536, 540, 544, 548, 552, 556, 560, 564. Since these transistors 536, 540, 544, 548, 552, 556, 560, 564 are N-type, they are in a conducting mode when a high level signal is applied.

The CPW_D pulse is applied to the control electrodes of the P-type transistors 501, 505, 509, 513, 517, 521, 525, 529, and the N-type transistors 504, 508, 512, 516, 520, 524, 528, 532. All four interpolators 340A, 340B, 340C, 340D receive either the true or delayed inverted CPW and CPW_D pulses. The interpolation then takes place under the control of the thermometer encode circuit 332 and the binary encoder provided by the gates 328, 333, 334. The control signals $T_{0X}$, $T_{0Y}$, $T_{0Z}$, $T_1$-$T_7$ and the complements thereof are provided to the correspondingly labeled gate electrodes. Depending on the value of the control signals $T_{0X}$, $T_{0Y}$, $T_{0Z}$, $T_1$-$T_7$, one of the upper or lower two transistors in each leg will turn on and if the corresponding second transistor is turned on by either the CPW or CPW_D pulse then that half of the leg will turn on pulling the output up or down (depending on whether the upper two or lower two transistors are conducting). The control signals $T_{0X}$, $T_{0Y}$, $T_{0Z}$, $T_1$-$T_7$ are provided to all four analog interpolators 340A, 340B, 340C, 340D. In this example, the FPWM pulse will end a certain time delay after the CPW pulse ends, that time delay being determined by the control signals $T_{0X}$, $T_{0Y}$, $T_{0Z}$, $T_1$-$T_7$ from the LSB signals.

The P-type and N-type transistors may be designed to achieve the desired performance and polarity pulse at the output of each analog interpolator stage. Also, the differential amplifier 360 can have true and complement outputs.

As previously noted, the value of the control signals $T_{0X}$, $T_{0Y}$, $T_{0Z}$, $T_1$-$T_7$ to the analog interpolator are shown in the truth tables of FIGS. 4A, 4B. The truth tables illustrate which transistors are turned on and off. Briefly, if all the control signals provide a "0", then all the transistors 535, 539, 543, 547, 551, 555, 559, 563 will receive inverted "0"s, i.e. "1"s and will be conditioned ON. At the same time, the transistors 503, 507, 511, 515, 519, 523, 527, 531 will be conditioned OFF. In this scenario, the output will cause a falling pulse end (in the FPWM signal) with the fall of the CPW pulse. As an increasing number of control inputs change to "1" and in particular after all inputs change to "1", the output will cause a falling pulse change (in the FPWM signal) with the fall of the CPW_D pulse (i.e. a pulse width of about 4.5).

As the desired pulse width becomes greater than 4.5, the CPW_DD pulse replaces the CPW pulse. At the same time, the inputs to the decoders are inverted by exclusive the OR gates 322, 324, 326, 328 (FIG. 3). Therefore, an all "0"s input from the LSBs actually provides an all "1"s input (inverted to "0"s) turning the transistors 535, 539, 543, 547, 551, 555, 559, 563 OFF.

This configuration results in the falling edge of the FPWM signal to be the same as the falling edge of CPW_D. As the binary number identifying the desired pulse width increases, an increasing number of the transistors 535, 539, 543, 547, 551, 555, 559, 563 will turn ON. When all the transistors 535, 539, 543, 547, 551, 555, 559, 563 are ON, the (FPWM pulse width will have a falling edge at the same time as the falling edge of the CPW_DD pulse.

Figure 6:
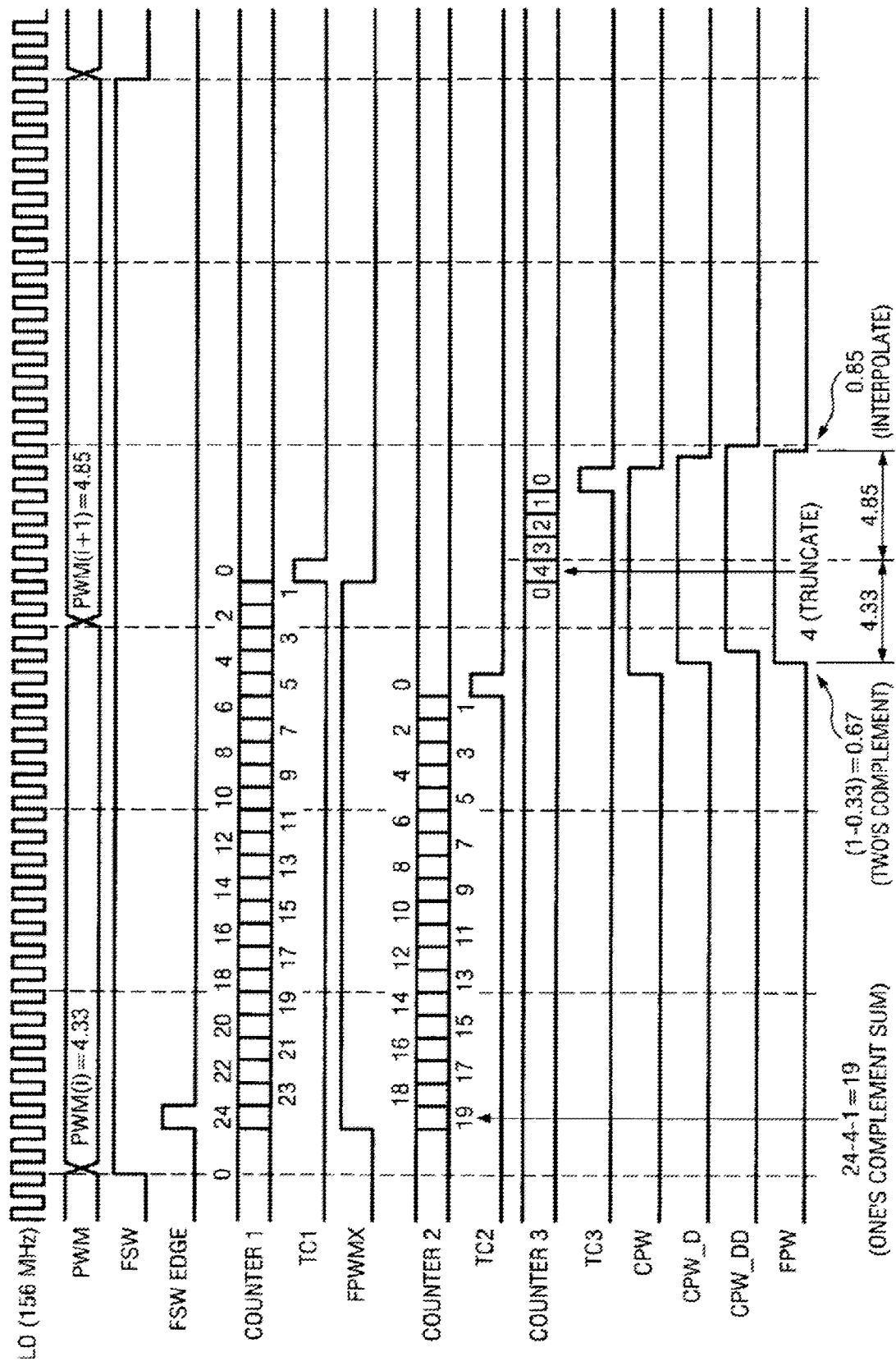
FIG. 6 is a waveform diagram illustrating the operation of a double edge modulation PWM generator, in accordance with some embodiments.

FIG. 6 is a waveform diagram illustrating the operation of the PWM generator 200, in accordance with some embodiments. The FLO signal is a high-speed train of pulses, where 24 clock cycles represents the time interval of a PWM clock switching frequency cycle, in one example. Two PWM clock switching frequency cycles, i.e. PWM(i)=4.33 and PWM(i+1)=4.85 are illustrated. The binary number representing the duty cycle of the first full cycle is 4.33 divided by 24 (the number of clock cycles corresponding to 100% duty cycle) and the binary number representing the duty cycle for the second cycle is 4.85 divided by 24. These numbers are normalized by the multiplier unit 204 (FIG. 2) which multiplies the duty cycle number input by Kmod (the number of clock cycles corresponding to 100% duty cycle, i.e. 24 in this example.

Referring to FIG. 3, for the first half cycle, the half clock period is loaded into the counter 206A, such that the end of the half period is known. At the same time, the digital pulse width word is truncated and inverted, generating the one's complement of the MSBs, and loaded into the counter 206B, corresponding to integral clock cycles of the coarse pulse width for the half cycle. The counter 206B is a down counter which generates a terminal count (TC2) when it reaches 1 and then stops at 0. TC2 is used to set the SR latch 216 and the output of the SR latch 216 for that half period is the coarse pulse width (CPW). Note that the CPW is rounded up from the pulse width word, since the one's complement was used. Note that the SR latch 216 can be an asynchronous SR latch, or the SR latch 216 can be synchronized to the clock signal. In either case the CPW will have the desired width.

For the second half of the cycle, the second digital pulse width word is truncated and loaded into the counter 206C, corresponding to integral clock cycles of the coarse pulse width for the second half cycle. The output of the counter 206C, TC3, is used to reset the SR latch 216 and the output of the SR latch 216 for that half period is the coarse pulse width (CPW). The total coarse pulse width is the rounded up value of the first pulse width word plus the rounded down value of the second pulse width word.

As shown in FIG. 6, the FSW edge pulse is utilized only once for every two PWM clock cycles. Also, three separate counters 206A, 206B, 206C are used to produce three separate counts. The counter 206A is loaded with the number 24 (the maximum count of clock cycles for 100% duty cycle) and begins counting down from the time it receives the FSW edge pulse at its "load" input. When it has counted down to "0", i.e. terminal count, it outputs the TC1 pulse to the counter 206C. The FPWMX pulse goes high with the rising edge of the FSW edge pulse and returns to its low level upon the occurrence of the TC1 pulse.

The counter 206B receives the binary number 19, which is the inverted input (one's complement sum) of 4, the binary number defined by the MSBs. When the counter 206B reaches its terminal count, the TC2 pulse is provided to the SR latch 216. The falling edge of TC2 initiates the rising edge of the CPW pulse at the output Q of the SR latch 216. The TC1 pulse initiates the down counting of the counter 206C which receives the binary number 4, the true value of the MSBs. The falling edge of TC3 resets the SR latch 216 causing the output Q to go down and results in the falling edge of the CPW pulse. The entire CPW pulse is then delayed once (in the half delay circuit 304) to produce the CPW_D signal and then again in the half delay circuit 310 (FIG. 3) to produce the CPW_DD signal. These signals result in the interpolation of both the rising and falling edges of the pulses in analog interpolators 240A, 340B, 340C, 340D.

Since in this example, the first pulse period is to have a fine pulse width of 4.33, the one's complement of binary 4, i.e. 19 is routed to the count input of the counter 206A and the value of 0.33 is routed to interpolator 208 (FIG. 2).

Referring to FIG. 6, for each half of the switching frequency cycle, the controller samples the load voltage, obtains the error voltage, and generates the appropriate pulse width for that half cycle. The output of the digital compensator 108 is representative of the desired duty cycle, which is normalized through the multiplier unit 204 to represent the number of clock cycles from a high frequency clock. In this case, samples alternate between modulating the rising edge and the falling edge, where the middle of the pulse is always fixed relative to FSW.

The end result is that the final FPWM pulse has a width of 4.33+4.85 in one continuous pulse of 9.18 over two PWM clock cycles. This width results from interpolating both the rising edges and the falling edges of the coarse pulses CPW, CPW_D, and CPW_DD. The interpolator 208 receives the LSBs from the duty cycle and the coarse pulse width, generating the final pulse width by interpolating between CPW and delayed replicas of the CPW.

Note that for the first half cycle, the delayed CPW waveform CPW_DD is one clock cycle narrower than CPW, whereas in the second half cycle, CPS_DD is one clock cycle wider. For the first half cycle, the proper interpolation can be obtained by using the two's complement of the LSBs. This can be obtained by inverting all the bits, then adding one. The addition by one can be accommodated by using the "redundant" LSB available at the fine interpolator. Since one of the weights in one of the stages is unused by the thermometer encode circuit 332, it can be set to 1 to accomplish the addition by one. This "redundant" LSB is controlled by the cycle indicator FPWMX. Furthermore, since the symmetric thermometer code is symmetric, there is no difference in whether the inverted or non-inverted input bits are used, so for this embodiment, the bit inversion can be eliminated. Finally, since the one's complement and the delay operation resulted in the CPW signal and the CPW_DD signal being essentially switched, then the multiplex select input also does not require inversion.

The FSW switching clock comes to its high level to start a switching frequency cycle. The FSW edge pulse comes to its high level after a delay and returns to its low level in one cycle of the FLO signal. The FSW edge pulse is the output of the edge detect circuit 214 (FIG. 2).

As CPW rises CPW_D and CPW_DD also rise after the appropriate delay. These high level pulses (CPW_D and CPW or CPW_DD) are applied to the analog interpolator 340A by the data elements 335A, 336A clocked by the SP1 subphase signal. The same pulses are slightly delayed and inverted are applied to the analog interpolator 340B by the data elements 335B, 336B clocked by the SP2 subphase signal. The same signals are slightly delayed and inverted again and applied to the analog interpolator 340C by the data elements 335C, 336C clocked by the SP3 subphase signal. The same delayed signals are delayed again and inverted again and applied to the analog interpolator 340D by the data elements 335D, 336D clocked by the SP4 subphase signal. At the same time the encoder outputs, i.e. control signals are applied at the transistor control electrodes $T_0$ to $T_7$ and the inverted control signals at $T_{0B}$ to $T_{7B}$, turning certain ones of the N-type and P-type transistors on depending on the actual value of the inputs. The result is that a certain number of legs will have the two series connected upside transistors conducting while a certain number of legs will have the two series connected downside transistors conducting. This determines the length of time delay at which the output changes state (zero crossing) after the falling edge of the coarse pulse has changed state. Thus, the pulse width of the FPWM pulse is determined by a falling edge that is an interpolation of the CPW_D and CPW or CPW_DD pulses.

The CPW pulse returns to its low level first as the TC pulse goes to its low level. In this example, the width of the CPW is 25.6 ns. (This pulse width is obtained from the binary number 4 (the value of the MSBs) times 6.4 ns (one cycle of the FLO signal). Note that if the binary value of the MSB correspond to the number 1 then the pulse width of CPW would be 6.4 ns.

The final width of the FPWM signal is 4.33 (less than 4.5), resulting from an interpolation between the trailing edge of CPW and CPW_D. This final interpolation takes place in the analog interpolators 340A, 340B, 340C, 340D which are digitally controlled to produce an analog sum by weights. However, noting that the multiplexer 306 outputs the CPW pulse in response to the most significant of the least significant bits LSBs (PWM[5]) providing a "0" input. Note that in the subsequent PWM cycle, i.e. PWM(i+1)=4.85 (greater than 4.5) where a pulse width generated in response to a binary 4.85 is desired, interpolation in the analog interpolators 340Z, 340B, 340C, 340D is between the falling edge of CPW_D and CPW_DD because the multiplexer 306 outputs the CPW_DD pulse in response to the most significant LSB (PWM[5]) providing a "1" input. The disclosed circuitry provides a smooth transition in each step of interpolation, including the step where the falling edge of the FPWM pulse transitions from the final interpolation with CPW to the initial interpolation with CPW_DD.

Figure 7:
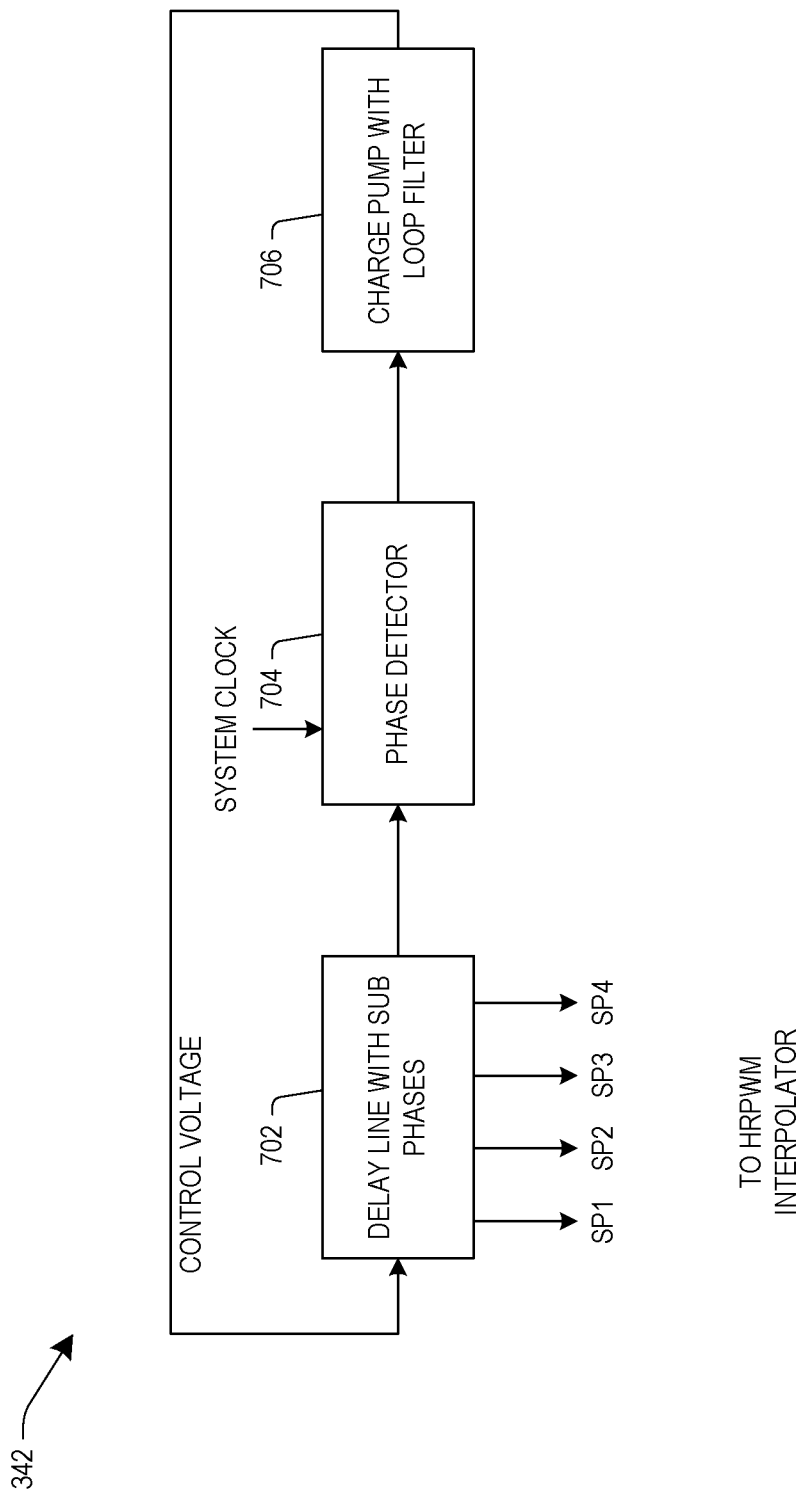
FIG. 7 is a simplified block diagram of a delay locked loop, in accordance with some embodiments.

FIG. 7 is a simplified block diagram of the DDLL 342, in accordance with some embodiments. The DDLL 342 comprises a delay line 702 with sub phase outputs, a phase detector 704, and a charge pump with a loop filter 706. For example, the delay line 702 may comprise a linear arrangement of delay elements where the overall delay depends on a control voltage applied to the delay line 702. The subphases comprises taps off the intermediate delay elements at fractions of the overall delay to generate subphase signals SP1, SP2, SP3, SP4. The phase detector 704 compares the output of the delay line 702 with the system clock and provides a phase error signal to the charge pump with loop filter 706. The charge pump with loop filter 706 generates a control voltage that changes the delay provided by the delay line 702 to reduce the phase error, thereby synchronizing the output of the delay line 702 with the system clock.

Figure 8:
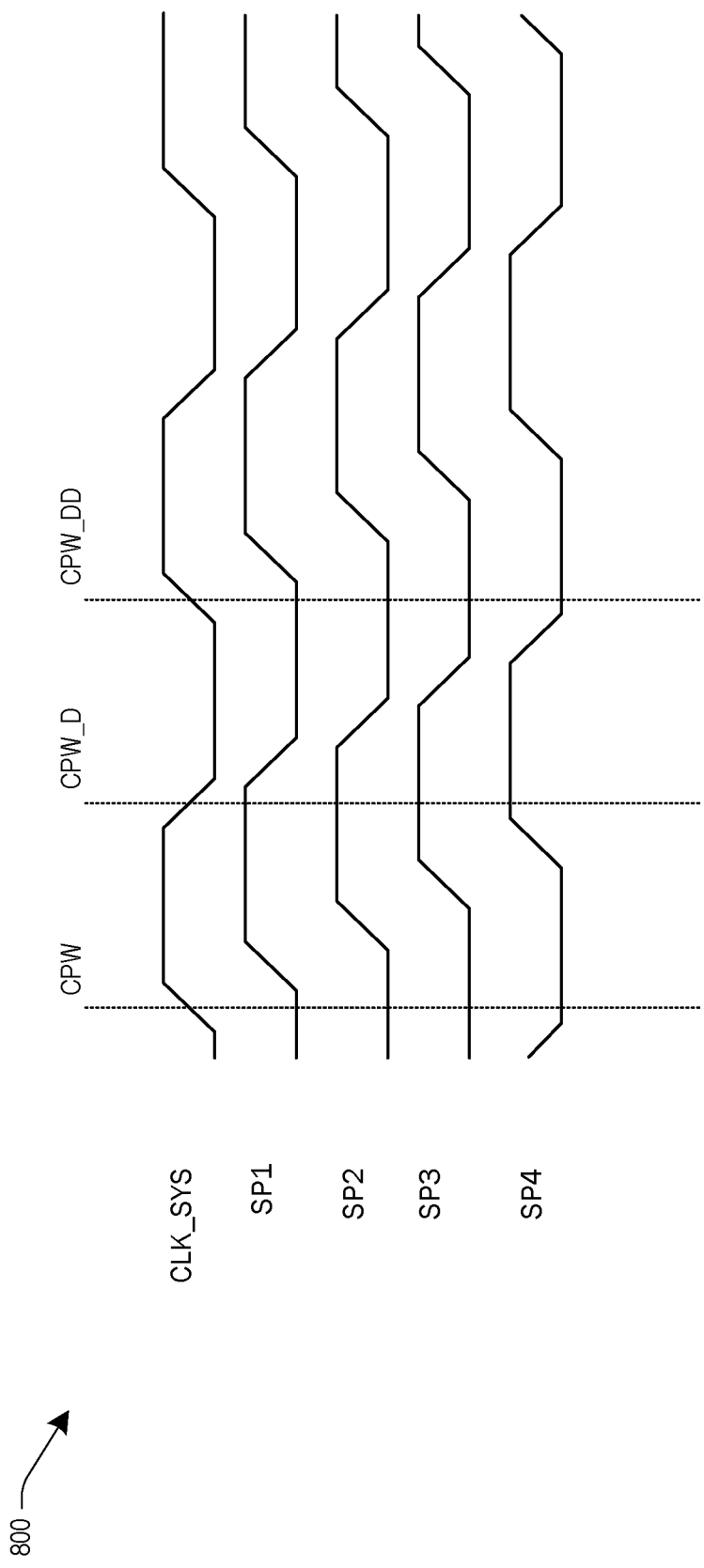
FIG. 8 is a signal diagram illustrating the operation of a delay locked loop, in accordance with some embodiments.

FIG. 8 is a signal diagram 800 illustrating the operation of the DDLL 342, in accordance with some embodiments. The signal diagram 800 illustrates a system clock signal (CLK_SYS) and the subphase signals SP1, SP2, SP3, SP4 generated by the DDLL 342. The CPW signal is synchronized with a rising edge of the system clock signal, the CPW_D signal is synchronized with a falling edge of the system clock signal (half cycle delay), and the CPW_DD is synchronized with a rising edge of the system clock delated by a full cycle.

The subphase signals SP1, SP2, SP3, SP4 provide clock inputs for the data elements 335A, 335B, 335C, 335D, 336A, 336B, 336C, 336D for latching the values of the CPW, CPW_D, or CPW_DD signals for controlling the analog interpolators 340A, 340B, 340C, 340D. The data element 335A, 335C, 336B, 336D are latched by inverted versions of the subphase signals SP1, SP2, SP3, SP4 so they clock on the falling edges of the subphase signals SP1, SP3, SP2, SP4, respectively, while the data elements 225B, 335D, 336A, 336C are latched by rising edges of the subphase signals SP2, SP4, SP1, SP3, respectively.

In some embodiments, the subphase signals SP1, SP2, SP3, SP4 overlapping skew regions between high and low states. The timing of the subphase signals SP1, SP2, SP3, SP4 is selected such that the skew regions overlap between adjacent subphases. Overlapping the skew regions allows the detection of the edge transitions in the CPW, CPW_D, or CPW_DD signals in overlapping detection regions such that the transition will be captured in one of the pairs of data elements 335A, 335B, 335C, 335D, 336A, 336B, 336C, 336D clocked by the subphase signals SP1, SP2, SP3, SP4. For example one of the "335" data elements 335A, 335B, 335C, 335D will capture a "high" signal level and the paired "336" data element 336A, 336B, 336C, 336D will capture a "low" signal, thereby capturing the falling edge of the CPW pulse. One of the analog interpolators 340A, 340B, 340C, 340D will be activated by the pair of data elements 335A, 335B, 335C, 335D, 336A, 336B, 336C, 336D capturing the falling edge to generate the FPWM signal based on the configured fine pulse width.

Figure 9:
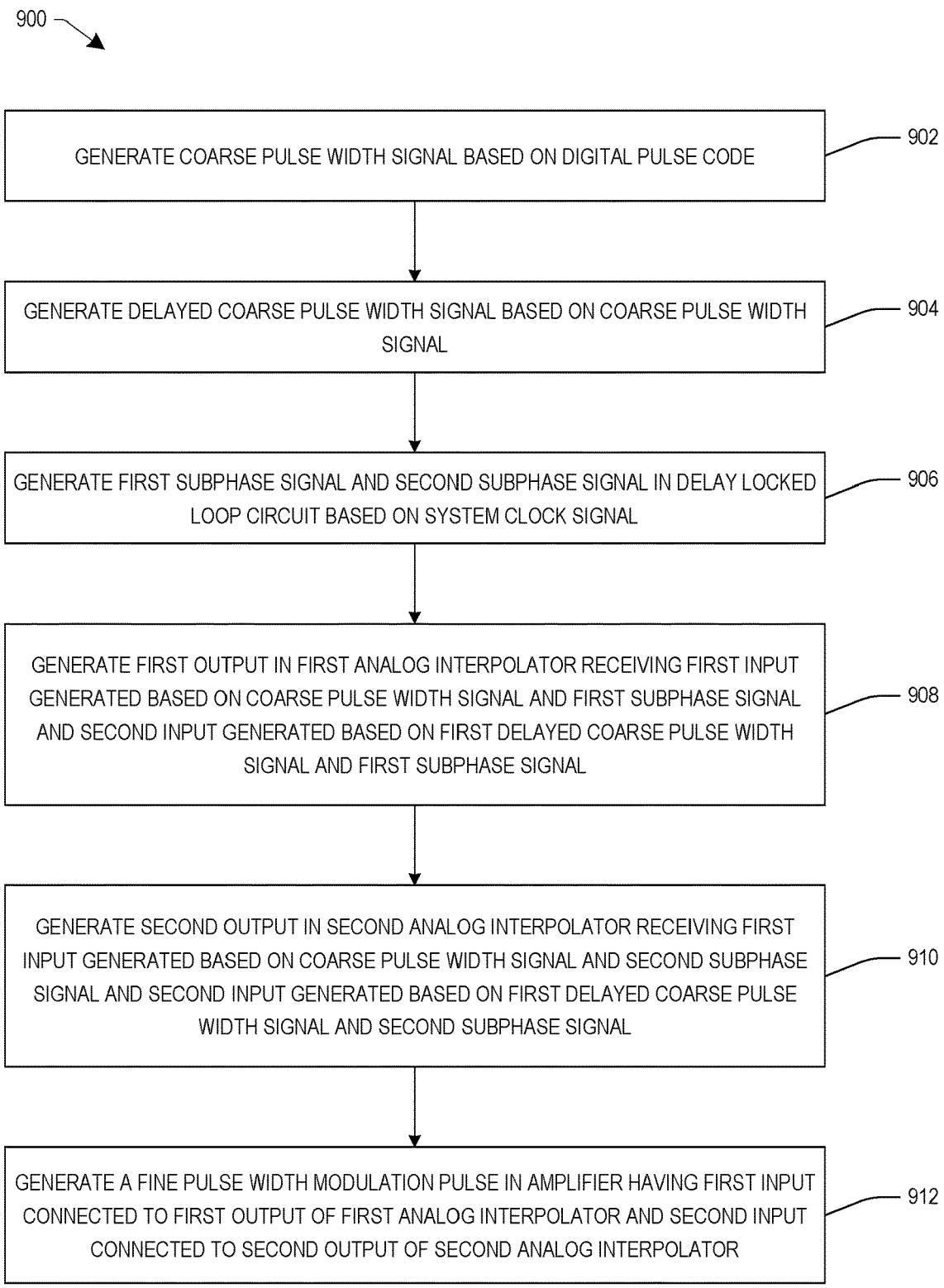
FIG. 9 is a flow diagram of a method for generating a PWM pulse, in accordance with some embodiments.

FIG. 9 is a flow diagram of a method 900 for generating a PWM pulse, in accordance with some embodiments. At 902, a coarse pulse width signal is generated based on a digital pulse code. At 904, a delayed coarse pulse width signal is generated based on the coarse pulse width signal. At 906, a first subphase signal and a second subphase signal are generated in a delay locked loop circuit based on a system clock signal. In some embodiments, the first subphase signal having a first overlapping skew region with the second subphase signal. At 908, a first output is generated in a first analog interpolator receiving a first input generated based on the coarse pulse width signal and the first subphase signal and a second input generated based on the first delayed coarse pulse width signal and the first subphase signal. The first output has a first delay configured based on the digital pulse code. At 910, a second output is generated in a second analog interpolator receiving a first input generated based on the coarse pulse width signal and the second subphase signal and a second input generated based on the first delayed coarse pulse width signal and the second subphase signal. The second output has a second delay configured based on the digital pulse code. At 912, a fine pulse width modulation signal is generated in an amplifier having a first input connected to the first output of the first analog interpolator and a second input connected to the second output of the second analog interpolator.

According to some embodiments, a pulse generator comprises a circuit configured to generate a coarse pulse width signal based on a digital pulse code, a first delay unit configured to generate a first delayed coarse pulse width signal, a delay locked loop circuit configured to generate a first subphase signal and a second subphase signal based on a system clock signal, a first analog interpolator having a first input generated based on the coarse pulse width signal and the first subphase signal, a second input generated based on the first delayed coarse pulse width signal and the first subphase signal, and an output having a first delay configured based on the digital pulse code, a second analog interpolator having a first input generated based on the coarse pulse width signal and the second subphase signal, a second input generated based on the first delayed coarse pulse width signal and the second subphase signal, and an output having a second delay configured based on the digital pulse code, and an amplifier having a first input connected to the output of the first analog interpolator and a second input connected to the output of the second analog interpolator and configured to generate a fine pulse width modulation signal.

According to some embodiments, the pulse generator comprises a first data element clocked by the first subphase signal and having an input connected to the coarse pulse width signal and configured to generate the first input of the first analog interpolator, a second data element clocked by the first subphase signal and having an input connected to the first delayed coarse pulse width signal and configured to generate the second input of the first analog interpolator, a third data element clocked by the second subphase signal and having an input connected to the coarse pulse width signal and configured to generate the first input of the second analog interpolator, and a fourth data element clocked by the second subphase signal and having an input connected to the first delayed coarse pulse width signal and configured to generate the second input of the second analog interpolator.

According to some embodiments, the pulse generator comprises a second delay unit configured to generate a second delayed coarse pulse width signal having a delay greater than a delay of the first delayed coarse pulse width signal, and a multiplexer configured to provide one of the coarse pulse width signal or the second delayed coarse pulse width signal to the input of the first data element and the input of the third data element, wherein the multiplexer is configured based on the digital pulse code.

According to some embodiments, the first input of the first analog interpolator is connected to a non-inverted output of the first data element, the second input of the first analog interpolator is connected to an inverted output of the second data element, the first input of the second analog interpolator is connected to a non-inverted output of the third data element, and the second input of the second analog interpolator is connected in an inverted output of the fourth data element.

According to some embodiments, a clock input of the first data element connected to receive the first subphase signal is inverted, and a clock input of the fourth data element connected to receive the second subphase signal is inverted.

According to some embodiments, the first subphase signal has a first overlapping skew region with the second subphase signal, the delay locked loop circuit is configured to generate a third subphase signal and a fourth subphase signal based on the system clock signal, the third subphase signal has a second overlapping skew region with the second subphase signal and a third overlapping skew region with the fourth subphase signal, the pulse generator comprises a fifth data element clocked by the third subphase signal and having an input connected to the coarse pulse width signal, the pulse generator comprises a sixth data element clocked by the third subphase signal and having an input connected to the first delayed coarse pulse width signal, the pulse generator comprises a seventh data element clocked by the fourth subphase signal and having an input connected to the coarse pulse width signal, the pulse generator comprises an eighth data element clocked by the fourth subphase signal and having an input connected to the first delayed coarse pulse width signal, the pulse generator comprises a third analog interpolator having a first input connected to the fifth data element, a second input connected to the sixth data element, and an output having a third delay configured based on the digital pulse code, the pulse generator comprises a fourth analog interpolator having a first input connected to the seventh data element, a second input connected to the eighth data element, and an output having a fourth delay configured based on the digital pulse code, and the first input of the amplifier is connected to the output of the third analog interpolator, and the second input of the amplifier is connected to the output of the fourth analog interpolator.

According to some embodiments, the amplifier comprises a differential input to single ended output amplifier, and the second input of the amplifier comprises an inverted input.

According to some embodiments, the delay locked loop circuit comprises a delay line having a configurable delay based on a control voltage and comprises a first subphase output to generate the first subphase signal and a second subphase output to generate the first subphase signal, a phase detector configured to determine a phase offset between the system clock signal and an output of the delay line, and a charge pump with a loop filter configured to modify the control voltage based on the phase offset to synchronize the delay line with the system clock signal.

According to some embodiments, a method comprises generating a coarse pulse width signal based on a digital pulse code, generating a first delayed coarse pulse width signal based on the coarse pulse width signal, generating a first subphase signal and a second subphase signal in a delay locked loop circuit based on a system clock signal, generating a first output in a first analog interpolator receiving a first input generated based on the coarse pulse width signal and the first subphase signal and a second input generated based on the first delayed coarse pulse width signal and the first subphase signal, the first output having a first delay configured based on the digital pulse code, generating a second output in a second analog interpolator receiving a first input generated based on the coarse pulse width signal and the second subphase signal and a second input generated based on the first delayed coarse pulse width signal and the second subphase signal, the second output having a second delay configured based on the digital pulse code, and generating a fine pulse width modulation signal in an amplifier having a first input connected to the first output of the first analog interpolator and a second input connected to the second output of the second analog interpolator.

According to some embodiments, the method comprises storing a first value of the coarse pulse width signal in a first data element clocked by the first subphase signal to generate the first input of the first analog interpolator, storing a first value of the first delayed coarse pulse width signal in a second data element clocked by the first subphase signal to generate the first second of the first analog interpolator, storing a second value of the coarse pulse width signal in a third data element clocked by the second subphase signal to generate the first input of the second analog interpolator, storing a second value of the first delayed coarse pulse width signal in a fourth data element clocked by the second subphase signal to generate the second input of the second analog interpolator.

According to some embodiments, the method comprises generating a second delayed coarse pulse width signal having a delay greater than a delay of the first delayed coarse pulse width signal, and selectively providing one of the coarse pulse width signal or the second delayed coarse pulse width signal to an input of the first data element and an input of the third data element based on the digital pulse code.

According to some embodiments, the method comprises connecting a first input of the first analog interpolator to a non-inverted output of the first data element, connecting a second input of the first analog interpolator to an inverted output of the second data element, connecting a first input of the second analog interpolator to a non-inverted output of the third data element, and connecting a second input of the second analog interpolator to an inverted output of the fourth data element.

According to some embodiments, the method comprises inverting a clock input of the first data element connected to receive the first subphase signal, and inverting a clock input of the fourth data element connected to receive the second subphase signal.

According to some embodiments, the method comprises generating a third subphase signal and a fourth subphase signal in the delay locked loop circuit based on the system clock signal, the first subphase signal having a first overlapping skew region with the second subphase signal and the third subphase signal having a second overlapping skew region with the second subphase signal and a third overlapping skew region with the fourth subphase signal, storing a third value of the coarse pulse width signal in a fifth data element clocked by the third subphase signal, storing a third value of the first delayed coarse pulse width signal in a sixth data element clocked by the third subphase signal, storing a fourth value of the coarse pulse width signal in a seventh data element clocked by the fourth subphase signal, storing a fourth value of the first delayed coarse pulse width signal in an eighth data element clocked by the fourth subphase signal, generating a third output in a third analog interpolator connected to an output of the fifth data element and an output of the sixth data element, the third output having a third delay configured based on the digital pulse code, generating a fourth output in a fourth analog interpolator connected to an output of the seventh data element and an output of the eighth data element, the fourth output having a fourth delay configured based on the digital pulse code, connecting the first input of the amplifier to the third output of the third analog interpolator, and connecting the second input of the amplifier to the fourth output of the fourth analog interpolator.

According to some embodiments, the amplifier comprises a differential input to single ended output amplifier, and the method comprises inverting the second input of the amplifier.

According to some embodiments, generating the first subphase signal and the second subphase signal in the delay locked loop circuit comprises configuring a delay line based on a control voltage, determining a phase offset between the system clock signal and an output of the delay line, modifying the control voltage based on the phase offset to synchronize the delay line with the system clock signal, generating the first subphase signal at a first output of the delay line, and generating the second subphase signal at a second output of the delay line.

According to some embodiments, a digital controller comprises an analog-to-digital converter configured to generate a feedback voltage, a voltage control unit configured to generate a target voltage, a digital compensator configured to receive a voltage error signal based on the feedback voltage and the target voltage and generate a digital pulse code based on the voltage error signal, and a pulse generator configured to generate a fine pulse width modulation signal based on the digital pulse code, the pulse generator comprising a circuit configured to generate a coarse pulse width signal based on the digital pulse code, a first delay unit configured to generate a first delayed coarse pulse width signal, a delay locked loop circuit configured to generate a first subphase signal and a second subphase signal based on a system clock signal, a first analog interpolator having a first input generated based on the coarse pulse width signal and the first subphase signal, a second input generated based on the first delayed coarse pulse width signal and the first subphase signal, and an output having a first delay configured based on the digital pulse code, a second analog interpolator having a first input generated based on the coarse pulse width signal and the second subphase signal, a second input generated based on the first delayed coarse pulse width signal and the second subphase signal, and an output having a second delay configured based on the digital pulse code, and an amplifier having a first input connected to the output of the first analog interpolator and a second input connected to the output of the second analog interpolator and configured to generate the fine pulse width modulation signal.

According to some embodiments, the pulse generator comprises a first data element clocked by the first subphase signal and having an input connected to the coarse pulse width signal, a second data element clocked by the first subphase signal and having an input connected to the delayed coarse pulse width signal, a third data element clocked by the second subphase signal and having an input connected to the coarse pulse width signal, a fourth data element clocked by the second subphase signal and having an input connected to the delayed coarse pulse width signal, a second delay unit configured to generate a second delayed coarse pulse width signal having a delay greater than a delay of the first delayed coarse pulse width signal, and a multiplexer configured to provide one of the coarse pulse width signal or the second delayed coarse pulse width signal to the input of the first data element and the input of the third data element, wherein the multiplexer is configured based on the digital pulse code.

According to some embodiments, the first subphase signal has a first overlapping skew region with the second subphase signal, the delay locked loop circuit is configured to generate a third subphase signal and a fourth subphase signal based on the system clock signal, the third subphase signal has a second overlapping skew region with the second subphase signal and a third overlapping skew region with the fourth subphase signal, the pulse generator comprises a fifth data element clocked by the third subphase signal and having an input connected to the coarse pulse width signal, the pulse generator comprises a sixth data element clocked by the third subphase signal and having an input connected to the delayed coarse pulse width signal, the pulse generator comprises a seventh data element clocked by the fourth subphase signal and having an input connected to the coarse pulse width signal, the pulse generator comprises an eighth data element clocked by the fourth subphase signal and having an input connected to the delayed coarse pulse width signal, the pulse generator comprises a third analog interpolator having a first input connected to the fifth data element, a second input connected to the sixth data element, and an output having a third delay configured based on the digital pulse code, the pulse generator comprises a fourth analog interpolator having a first input connected to the seventh data element, a second input connected to the eighth data element, and an output having a fourth delay configured based on the digital pulse code, the first input of the amplifier is connected to the output of the third analog interpolator, and the second input of the amplifier is connected to the output of the fourth analog interpolator.

According to some embodiments, the delay locked loop circuit comprises a delay line having a configurable delay based on a control voltage and comprises a first subphase output to generate the first subphase signal and a second subphase output to generate the first subphase signal, a phase detector configured to determine a phase offset between the system clock signal and an output of the delay line, and a charge pump with a loop filter configured to modify the control voltage based on the phase offset to synchronize the delay line with the system clock signal.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Any aspect or design described herein as an "example" and/or the like is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing at least some of the claims.

As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A pulse generator, comprising:
a circuit configured to generate a coarse pulse width signal based on a digital pulse code;
a first delay unit configured to generate a first delayed coarse pulse width signal;
a delay locked loop circuit configured to generate a first subphase signal and a second subphase signal based on a system clock signal;
a first analog interpolator having a first input generated based on the coarse pulse width signal and the first subphase signal, a second input generated based on the first delayed coarse pulse width signal and the first subphase signal, and an output having a first delay configured based on the digital pulse code;

a second analog interpolator having a first input generated based on the coarse pulse width signal and the second subphase signal, a second input generated based on the first delayed coarse pulse width signal and the second subphase signal, and an output having a second delay configured based on the digital pulse code; and an amplifier having a first input connected to the output of the first analog interpolator and a second input connected to the output of the second analog interpolator and configured to generate a fine pulse width modulation signal.

2. The pulse generator of claim 1, comprising:

a first data element clocked by the first subphase signal and having an input connected to the coarse pulse width signal and configured to generate the first input of the first analog interpolator;

a second data element clocked by the first subphase signal and having an input connected to the first delayed coarse pulse width signal and configured to generate the second input of the first analog interpolator;

a third data element clocked by the second subphase signal and having an input connected to the coarse pulse width signal and configured to generate the first input of the second analog interpolator; and a fourth data element clocked by the second subphase signal and having an input connected to the first delayed coarse pulse width signal and configured to generate the second input of the second analog interpolator.

3. The pulse generator of claim 2, comprising:

a second delay unit configured to generate a second delayed coarse pulse width signal having a delay greater than a delay of the first delayed coarse pulse width signal; and a multiplexer configured to provide one of the coarse pulse width signal or the second delayed coarse pulse width signal to the input of the first data element and the input of the third data element, wherein:

the multiplexer is configured based on the digital pulse code.

4. The pulse generator of claim 2, wherein:

the first input of the first analog interpolator is connected to a non-inverted output of the first data element;

the second input of the first analog interpolator is connected to an inverted output of the second data element;

the first input of the second analog interpolator is connected to a non-inverted output of the third data element; and the second input of the second analog interpolator is connected in an inverted output of the fourth data element.

5. The pulse generator of claim 2, wherein:

a clock input of the first data element connected to receive the first subphase signal is inverted; and a clock input of the fourth data element connected to receive the second subphase signal is inverted.

6. The pulse generator of claim 2, wherein:

the first subphase signal has a first overlapping skew region with the second subphase signal;

the delay locked loop circuit is configured to generate a third subphase signal and a fourth subphase signal based on the system clock signal;

the third subphase signal has a second overlapping skew region with the second subphase signal and a third overlapping skew region with the fourth subphase signal;

the pulse generator comprises a fifth data element clocked by the third subphase signal and having an input connected to the coarse pulse width signal;

the pulse generator comprises a sixth data element clocked by the third subphase signal and having an input connected to the first delayed coarse pulse width signal;

the pulse generator comprises a seventh data element clocked by the fourth subphase signal and having an input connected to the coarse pulse width signal;

the pulse generator comprises an eighth data element clocked by the fourth subphase signal and having an input connected to the first delayed coarse pulse width signal;

the pulse generator comprises a third analog interpolator having a first input connected to the fifth data element, a second input connected to the sixth data element, and an output having a third delay configured based on the digital pulse code;

the pulse generator comprises a fourth analog interpolator having a first input connected to the seventh data element, a second input connected to the eighth data element, and an output having a fourth delay configured based on the digital pulse code;

the first input of the amplifier is connected to the output of the third analog interpolator; and the second input of the amplifier is connected to the output of the fourth analog interpolator.

7. The pulse generator of claim 1, wherein:

the amplifier comprises a differential input to single ended output amplifier; and the second input of the amplifier comprises an inverted input.

8. The pulse generator of claim 1, wherein the delay locked loop circuit comprises:

a delay line having a configurable delay based on a control voltage and comprising a first subphase output to generate the first subphase signal and a second subphase output to generate the first subphase signal;

a phase detector configured to determine a phase offset between the system clock signal and an output of the delay line; and a charge pump with a loop filter configured to modify the control voltage based on the phase offset to synchronize the delay line with the system clock signal.

9. A method, comprising:

generating a coarse pulse width signal based on a digital pulse code;

generating a first delayed coarse pulse width signal based on the coarse pulse width signal;

generating a first subphase signal and a second subphase signal in a delay locked loop circuit based on a system clock signal;

generating a first output in a first analog interpolator receiving a first input generated based on the coarse pulse width signal and the first subphase signal and a second input generated based on the first delayed coarse pulse width signal and the first subphase signal, the first output having a first delay configured based on the digital pulse code;

generating a second output in a second analog interpolator receiving a first input generated based on the coarse pulse width signal and the second subphase signal and a second input generated based on the first delayed coarse pulse width signal and the second subphase signal, the second output having a second delay configured based on the digital pulse code; and generating a fine pulse width modulation signal in an amplifier having a first input connected to the first output of the first analog interpolator and a second input connected to the second output of the second analog interpolator.

10. The method of claim 9, comprising:
storing a first value of the coarse pulse width signal in a first data element clocked by the first subphase signal to generate the first input of the first analog interpolator;
storing a first value of the first delayed coarse pulse width signal in a second data element clocked by the first subphase signal to generate the first second of the first analog interpolator;
storing a second value of the coarse pulse width signal in a third data element clocked by the second subphase signal to generate the first input of the second analog interpolator; and
storing a second value of the first delayed coarse pulse width signal in a fourth data element clocked by the second subphase signal to generate the second input of the second analog interpolator.

11. The method of claim 10, comprising:
generating a second delayed coarse pulse width signal having a delay greater than a delay of the first delayed coarse pulse width signal; and
selectively providing one of the coarse pulse width signal or the second delayed coarse pulse width signal to an input of the first data element and an input of the third data element based on the digital pulse code.

12. The method of claim 10, comprising:
inverting a clock input of the first data element connected to receive the first subphase signal; and
inverting a clock input of the fourth data element connected to receive the second subphase signal.

13. The method of claim 10, comprising:
generating a third subphase signal and a fourth subphase signal in the delay locked loop circuit based on the system clock signal, the first subphase signal having a first overlapping skew region with the second subphase signal and the third subphase signal having a second overlapping skew region with the second subphase signal and a third overlapping skew region with the fourth subphase signal;
storing a third value of the coarse pulse width signal in a fifth data element clocked by the third subphase signal;
storing a third value of the first delayed coarse pulse width signal in a sixth data element clocked by the third subphase signal;
storing a fourth value of the coarse pulse width signal in a seventh data element clocked by the fourth subphase signal;
storing a fourth value of the first delayed coarse pulse width signal in an eighth data element clocked by the fourth subphase signal;
generating a third output in a third analog interpolator connected to an output of the fifth data element and an output of the sixth data element, the third output having a third delay configured based on the digital pulse code;
generating a fourth output in a fourth analog interpolator connected to an output of the seventh data element and an output of the eighth data element, the fourth output having a fourth delay configured based on the digital pulse code;

connecting the first input of the amplifier to the third output of the third analog interpolator; and
connecting the second input of the amplifier to the fourth output of the fourth analog interpolator.

14. The method of claim 9, comprising:
connecting a first input of the first analog interpolator to a non-inverted output of the first data element;
connecting a second input of the first analog interpolator to an inverted output of the second data element;
connecting a first input of the second analog interpolator to a non-inverted output of the third data element; and
connecting a second input of the second analog interpolator to an inverted output of the fourth data element.

15. The method of claim 9, wherein:
the amplifier comprises a differential input to single ended output amplifier; and
the method comprises inverting the second input of the amplifier.

16. The method of claim 9, wherein generating the first subphase signal and the second subphase signal in the delay locked loop circuit comprises:
configuring a delay line based on a control voltage;
determining a phase offset between the system clock signal and an output of the delay line;
modifying the control voltage based on the phase offset to synchronize the delay line with the system clock signal;
generating the first subphase signal at a first output of the delay line; and
generating the second subphase signal at a second output of the delay line.

17. A digital controller, comprising:
an analog-to-digital converter configured to generate a feedback voltage;
a voltage control unit configured to generate a target voltage;
a digital compensator configured to receive a voltage error signal based on the feedback voltage and the target voltage and generate a digital pulse code based on the voltage error signal; and
a pulse generator configured to generate a fine pulse width modulation signal based on the digital pulse code, the pulse generator comprising:
a circuit configured to generate a coarse pulse width signal based on the digital pulse code;
a first delay unit configured to generate a first delayed coarse pulse width signal;
a delay locked loop circuit configured to generate a first subphase signal and a second subphase signal based on a system clock signal;
a first analog interpolator having a first input generated based on the coarse pulse width signal and the first subphase signal, a second input generated based on the first delayed coarse pulse width signal and the first subphase signal, and an output having a first delay configured based on the digital pulse code;
a second analog interpolator having a first input generated based on the coarse pulse width signal and the second subphase signal, a second input generated based on the first delayed coarse pulse width signal and the second subphase signal, and an output having a second delay configured based on the digital pulse code; and
an amplifier having a first input connected to the output of the first analog interpolator and a second input connected to the output of the second analog interpolator and configured to generate the fine pulse width modulation signal.

18. The digital controller of claim 17, wherein the pulse generator comprises:
- a first data element clocked by the first subphase signal and having an input connected to the coarse pulse width signal;
- a second data element clocked by the first subphase signal and having an input connected to the delayed coarse pulse width signal;
- a third data element clocked by the second subphase signal and having an input connected to the coarse pulse width signal;
- a fourth data element clocked by the second subphase signal and having an input connected to the delayed coarse pulse width signal;
- a second delay unit configured to generate a second delayed coarse pulse width signal having a delay greater than a delay of the first delayed coarse pulse width signal; and
- a multiplexer configured to provide one of the coarse pulse width signal or the second delayed coarse pulse width signal to the input of the first data element and the input of the third data element, wherein:
- the multiplexer is configured based on the digital pulse code.

19. The digital controller of claim 18, wherein:
- the first subphase signal has a first overlapping skew region with the second subphase signal,
- the delay locked loop circuit is configured to generate a third subphase signal and a fourth subphase signal based on the system clock signal;
- the third subphase signal has a second overlapping skew region with the second subphase signal and a third overlapping skew region with the fourth subphase signal;
- the pulse generator comprises a fifth data element clocked by the third subphase signal and having an input connected to the coarse pulse width signal;
- the pulse generator comprises a sixth data element clocked by the third subphase signal and having an input connected to the delayed coarse pulse width signal;
- the pulse generator comprises a seventh data element clocked by the fourth subphase signal and having an input connected to the coarse pulse width signal;
- the pulse generator comprises an eighth data element clocked by the fourth subphase signal and having an input connected to the delayed coarse pulse width signal;
- the pulse generator comprises a third analog interpolator having a first input connected to the fifth data element, a second input connected to the sixth data element, and an output having a third delay configured based on the digital pulse code;
- the pulse generator comprises a fourth analog interpolator having a first input connected to the seventh data element, a second input connected to the eighth data element, and an output having a fourth delay configured based on the digital pulse code;
- the first input of the amplifier is connected to the output of the third analog interpolator; and
- the second input of the amplifier is connected to the output of the fourth analog interpolator.

20. The digital controller of claim 17, wherein the delay locked loop circuit comprises:
- a delay line having a configurable delay based on a control voltage and comprising a first subphase output to generate the first subphase signal and a second subphase output to generate the first subphase signal;
- a phase detector configured to determine a phase offset between the system clock signal and an output of the delay line; and
- a charge pump with a loop filter configured to modify the control voltage based on the phase offset to synchronize the delay line with the system clock signal.

* * * * *